United States Patent [19]

Kishimoto et al.

[11] Patent Number: 5,537,674
[45] Date of Patent: Jul. 16, 1996

[54] RECEIVER CAPABLE OF SELECTIVELY RECEIVING SIGNALS AT FREQUENCIES CORRESPONDING TO STORED BROADCASTING STATIONS

[75] Inventors: Yoshiteru Kishimoto; Shuichi Ninomiya; Kouichi Higuchi; Masayoshi Yano, all of Hirakata, Japan

[73] Assignee: Matsushita Electric Industrial Co., Ltd., Kadoma, Japan

[21] Appl. No.: 61,500

[22] Filed: May 14, 1993

Related U.S. Application Data

[63] Continuation of Ser. No. 752,643, filed as PCT/JP90/01517, Nov. 21, 1990, published as WO91/08618, Jun. 13, 1991, abandoned.

[30] Foreign Application Priority Data

Nov. 27, 1989 [JP] Japan ..................... 1-309679

[51] Int. Cl.$^6$ ..................................... H04B 1/16
[52] U.S. Cl. .................. 455/186.1; 455/158.5; 455/161.1
[58] Field of Search ............... 455/185.1, 186.1, 455/186.2, 184.1, 158.1, 158.2, 158.5, 161.1, 162.1, 167.1

[56] References Cited

U.S. PATENT DOCUMENTS 4,268,915  5/1981  Parmet .
4,409,688 10/1983  Baker ........................... 455/186.2
4,491,975  1/1985  Ito ................................ 455/186.1
4,833,728  5/1989  Kimura et al. .
4,969,209 11/1990  Schwob ......................... 455/158.5
5,001,775  3/1991  Hayashi et al. ............... 455/186.1
5,086,511  2/1992  Kobayashi .

FOREIGN PATENT DOCUMENTS 0387810   9/1990  European Pat. Off. .
3322987   1/1985  Germany .
3733028   4/1988  Germany .
55-41061 10/1980  Japan .
0062922   4/1983  Japan ........................... 455/185.1
59-230330 12/1984  Japan .
 314839   4/1991  Japan .
2064905   6/1981  United Kingdom .

*Primary Examiner*—Chi H. Pham
*Attorney, Agent, or Firm*—Cushman, Darby & Cushman

[57] ABSTRACT

The present invention relates to a receiver capable of selectively receiving the frequency of a radio broadcasting station stored in advance, which comprises a first memory for storing the frequencies of radio broadcasting stations in each of a plurality of areas, a second memory capable of storing the frequencies of arbitrary radio broadcasting stations and a selection operating device for selecting the frequency of the necessary radio broadcasting station from the memory, makes it possible to receive the frequency of the radio broadcasting station in the desired area by selection of the selection operating device, and thereby can promptly select the frequency of the radio broadcasting station of an area even on a private or business trip thereto.

8 Claims, 10 Drawing Sheets

RECEIVER CAPABLE OF SELECTIVELY RECEIVING SIGNALS AT FREQUENCIES CORRESPONDING TO STORED BROADCASTING STATIONS

This is a continuation of application No. 07/752,643, filed as PCT/JP90/01517, Nov. 21, 1990, published as WO91/08618, Jun. 13, 1991, which was abandoned upon the filing hereof.

TECHNICAL FIELD

The present invention relates to a receiver such as a PLL synthesizer receiver which can selectively receive the frequency of a stored radio broadcasting station.

BACKGROUND ART

Figure 12:
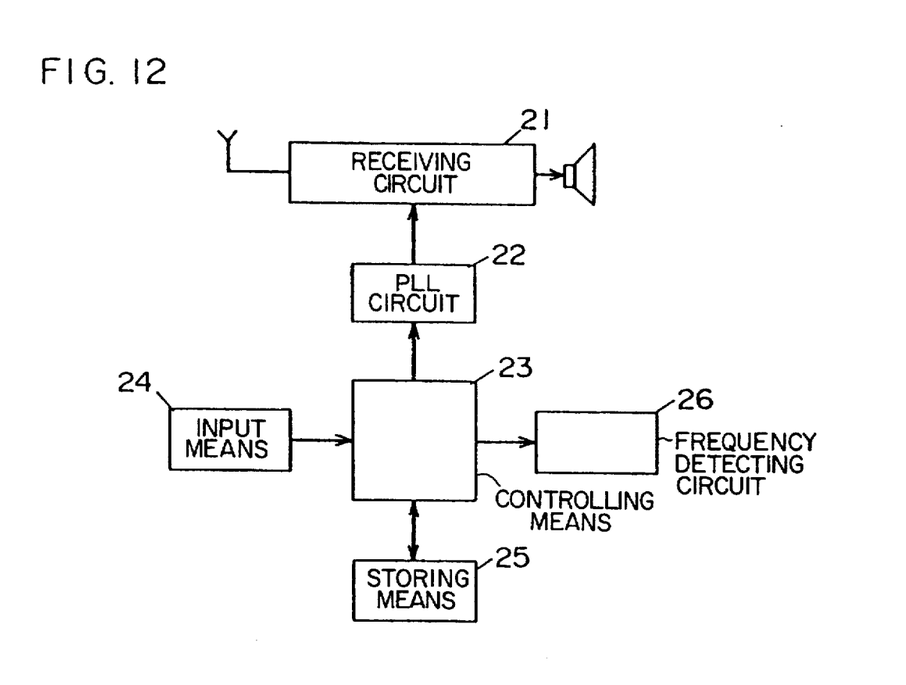
FIG. 12 is the block diagram showing a conventional receiver.

Conventionally, PLL synthesizer receivers are generally configured as shown in FIG. 12. That is, with regard to a receiving circuit 21, a PLL circuit 22 for selecting the receiving frequency is provided, and the frequency dividing ratio of a programmable frequency divider of this PLL circuit 22 is controlled by a controlling means 23, and thereby receiving is performed at a desired receiving frequency. Numeral 24 designates an operating means for providing an operating input to the above-mentioned controlling means 23, numeral 25 designates a storing means for storing desired frequencies of radio broadcasting stations, and numeral 26 designates a display unit of frequency and the like. Here, the above-mentioned operating means 24 comprises a band key for selecting a frequency band for selecting a receiving frequency of a station, a station select key for incremeting and dicrementing the frequency, and further a memory key for writing to a preset memory, and read keys such as a scroll key for reading stored frequencies (or a select key of a required number of memories).

Then, a radio broadcasting station of a desired receiving frequency is selected and listened to by the band key of the operating means 24 and the station select key of the operating means 24, and the selected receiving frequency is written to the storing means 25 by the memory key to be set as a preset memory, and the preset receiving frequency is read by operating the read key, and thereby receiving can be conducted.

However, in the above-mentioned conventional receiver, the receiving-frequencies of the desired radio broadcasting stations are stored in advance in the storing means, and can be read at any time as required to be received promptly, but, for example, in the case where this receiver is used in another area on a private or business trip, the receiving frequencies of the radio broadcasting stations which have been preset in advance cannot be used, and a troublesome receiving operation has to be undertaken while searching the frequency of the radio broadcasting station in that area. At this time, where the frequency of the radio broadcasting station in that area is unknown, there is no means other than searching for the frequency while varying the frequency in sequence.

DISCLOSURE OF THE INVENTION in the light of the conventional problem as described above, the present invention has been made for the purpose of providing a receiver which can promptly select the frequency of the radio broadcasting station of an area even on a journey or business trip thereto, can operated easily, and can write frequencies of arbitrary broadcasting stations.

In order to solve the above-mentioned problem, the receiver of the present invention comprises a first storing means for storing frequencies of radio broadcasting stations in each of a plurality of areas, a second storing means capable of storing frequencies of arbitrary radio broadcasting stations, a selection operating means for selecting the frequency of a necessary radio broadcasting station for the above-mentioned first storing means and second storing means, and a station selection controlling means for making it possible to receive the frequency of a radio broadcasting station in a desired area which is stored as mentioned above in correspondence with a selection of this selection operating means.

The above-mentioned selection operating means comprises a first selection operating means for selecting an area, and a second selection operating means for selecting the frequency of a necessary radio broadcasting station in that area.

The above-mentioned receiver comprises a display unit having an area name display part of a plurality of areas, a receiving frequency display part and/or a radio broadcasting station name display part, whereby each part is configured so as to be capable of selective display.

The station selection controlling means is configured so that area selection by the first selection operating means is made possible only when the receiver is in a non-receiving state.

The station selection controlling means is configured so that frequency selection by the station select switch is stopped when a selection by the first selection operating means selects an area of the first storing means, and an arbitrary selection of the receiving frequency by the station select switch is made possible when the second storing means is station-selected.

The present invention also is directed to receiver which can selectively receive the receiving frequency of a radio broadcasting station stored in advance by a predetermined operation, and comprises a first storing means for storing frequencies of radio broadcasting stations in each of a plurality of areas, a tuning detecting means for detecting tuning above a certain level, an automatic search start operating means for identifying the area of use, a second storing means which starts a sweep by a start signal of this automatic search start operating means and stores an appropriate receiving frequency at each stop of the sweep by an output of the above-mentioned tuning detecting means, and a station selection controlling means which compares the receiving frequency of this second storing means with the frequency stored in the above-mentioned storing means, selects the receiving area where both frequencies agree with each other, and makes it possible to receive the frequency of the radio broadcasting station in that area.

In the above-mentioned embodiment, a selection operating means for selecting the frequency of a necessary radio broadcasting station in the selected receiving area is installed.

In the above-mentioned embodiment, a third storing means capable of storing frequencies of arbitrary radio broadcasting stations and a selection operating means for selecting the frequencies in this third storing means are provided.

In the above-mentioned embodiment, the tuning detecting means is provided with an intensity detecting circuit detecting that the intensity of a signal received by amplitude detection of an intermediate-frequency signal is above a certain level and a frequency detecting circuit detecting whether or not the value of the frequency of the above-mentioned intermediate-frequency signal is a predetermined value, thereby performing a detection of the level of the received signal and a detection of agreement of frequencies.

In the above-mentioned embodiment, a displaying means is provided which displays that automatic search for the receiving area is being made after sweep has been started by an automatic search start operating means or displays that the search has become impossible.

A receiver can selectively receive the frequency of the stored radio broadcasting station, and comprises a frequency storing means for storing frequencies of radio broadcasting stations in each of a plurality of areas, a tuning detecting means for detecting the intensity of a signal above a certain level, a selection operating means for selecting the frequency of a necessary radio broadcasting station of the above-mentioned storing means, and a station selection controlling means which makes it possible to receive the frequency of the radio broadcasting station in the desired area stored as mentioned above in correspondence with a selection of this selection operating means, the above-mentioned station selection controlling means being configured to skip radio broadcasting stations below a certain level detected by the tuning detecting means in operation by the selection operating means.

In the present invention, according to the above-mentioned configuration, frequencies of radio broadcasting stations in an appropriate area stored on a receiving area basis can be selected by the selection operating means, area selection is performed by the first selection operating means, and memory selection of the desired radio broadcasting station is performed by the second selection operating means. Also, an area, frequency and/or a name of radio broadcasting station corresponding to a selection by the selection operating means are prominently displayed on a display unit.

Furthermore, area selection by the first selection operating means is performed only when the receiver is in a non-receiving state, and thereby an arbitrary change of the radio broadcasting station by an inadvertent operation of the first selection operating means during receiving can be prevented.

Furthermore, sweep is started by an automatic search start signal, the appropriate receiving frequency is stored at each stop of the sweep by the tuning detecting means, this stored receiving frequency is compared with the frequencies of radio broadcasting stations in a plurality of areas which are stored in advance, and thereby the receiving area where frequencies agree is selected, and receiving of the radio broadcasting station in that area can be made possible, and that the station search is being made can be displayed by the displaying means.

Furthermore, where the level of the received signal of a radio broadcasting station set in advance in the selected receiving area is below a certain level, the radio broadcasting station is skipped.

DETAILED DESCRIPTION OF THE PRESENTLY PREFERRED EXEMPLARY EMBODIMENTS

Figure 1:
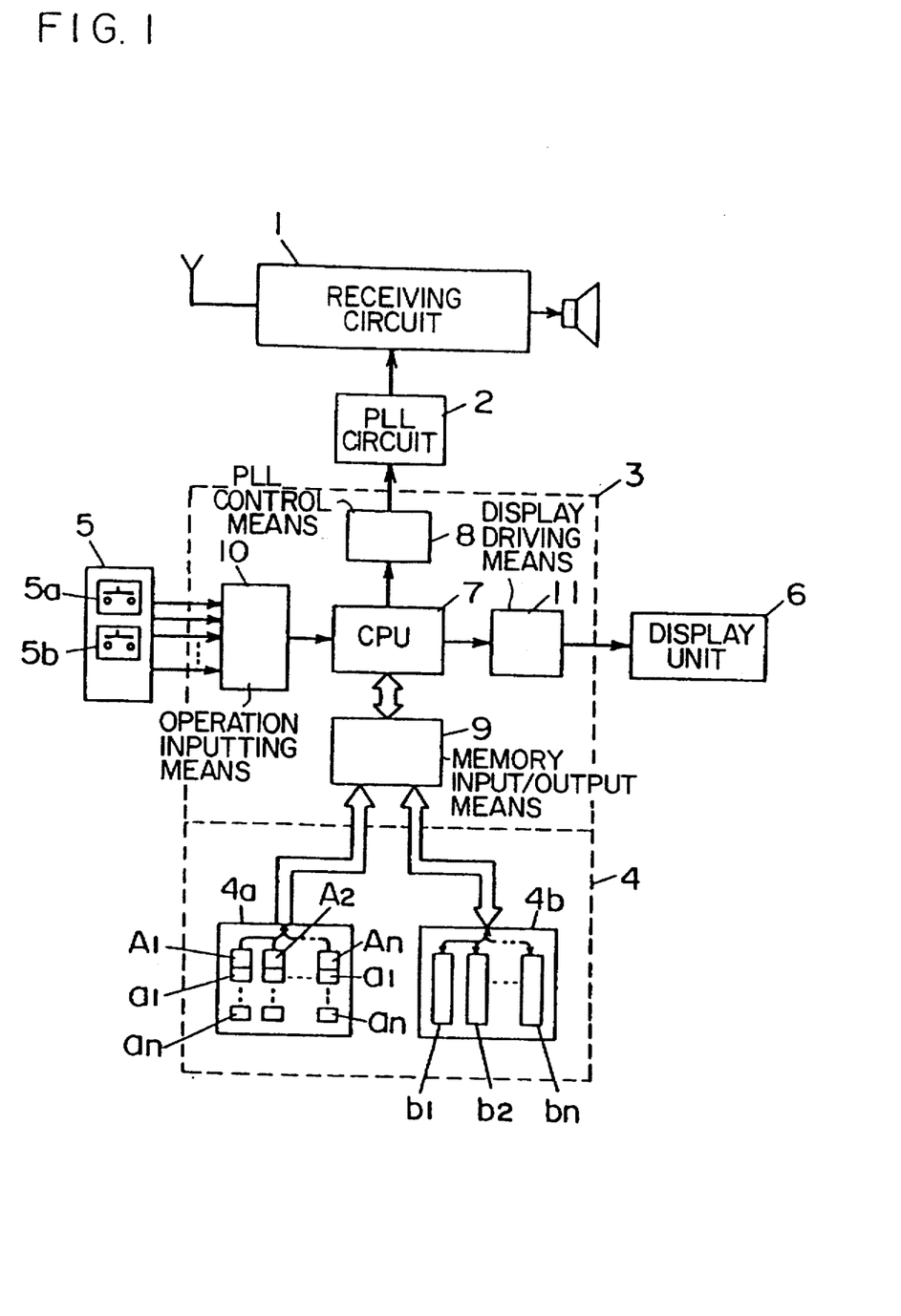
FIG. 1 is a block diagram showing a first embodiment of a receiver according to the present invention.
Figure 2:
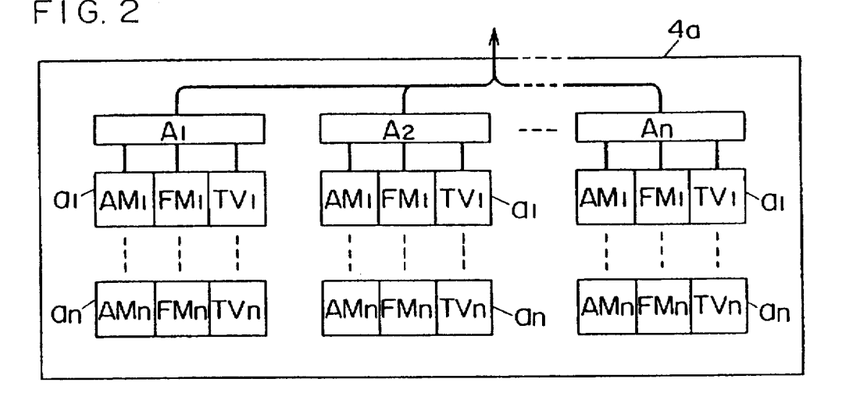
FIG. 2 is a memory configuration view of a first storing means of the same.
Figure 3:
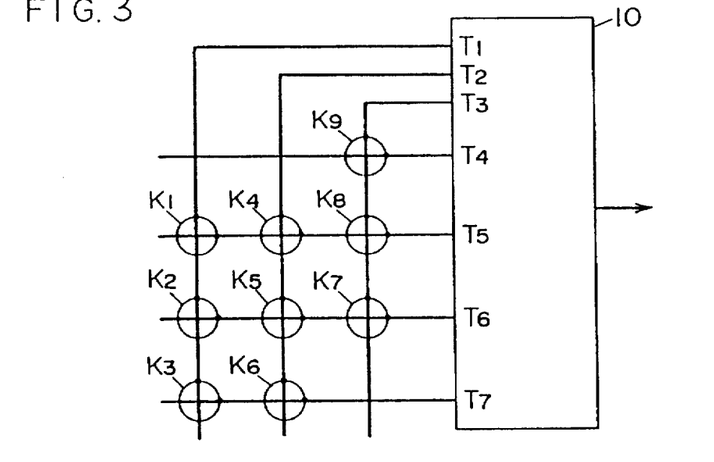
FIG. 3 is a circuit diagram showing a specific example of a selection operating means of the same.
Figure 4:
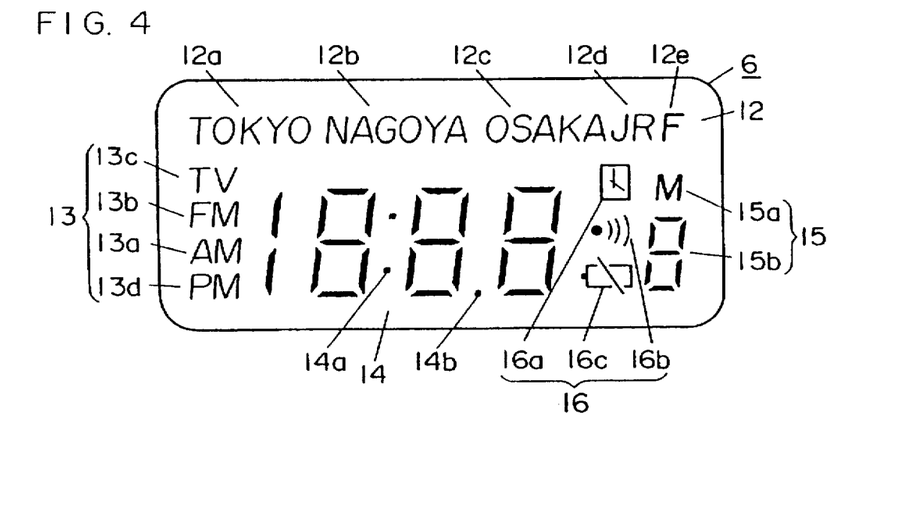
FIG. 4 is a front view showing a configuration of display parts of a display unit of the same.

Hereinafter, description is made of a first embodiment of a receiver of the present invention in reference to the following drawings. FIG. 1 is a block diagram thereof, FIG. 2 is a configuration view of a first storing means, FIG. 3 is a configuration view or a selection operating means, and FIG. 4 is a front view showing a display of a display unit.

In the drawings, numeral 1 designates a receiving circuit, and numeral 2 designates a PLL circuit determining the receiving frequency thereof, and the receiving frequency, that is, the radio broadcasting station is determined by controlling the frequency dividing ratio of a programmable frequency divider of this PLL circuit 2. Numeral 3 designates a station selection controlling means for controlling the above-mentioned PLL circuit 2, numeral 4 designates a memory, numeral 5 designates a selection operating means for selecting the frequency of the receiving radio broadcasting station, numeral 6 designates a display unit, and in correspondence with an operation of the selection operating means 5, the station selection controlling means 3 outputs a control command of the receiving frequency to the PLL circuit 2 and a required display command to the display unit 6, and performs a command of a write to or a read from the memory 4.

The above-mentioned controlling means 3 comprises a CPU 7, a PLL controlling means 8 for controlling specifically the frequency dividing ratio of the above-mentioned PLL circuit 2 by a command of the CPU 7, a memory inputting/outputting means 9 for writing or reading the receiving frequency to or from the memory 4 by a command of the above-mentioned CPU 7, an operation inputting means 10 for sending a code signal to the CPU 7 in correspondence with an operation of the above-mentioned operation part 5, and a display unit driving means 11 for performing display control of the display unit 6 by a command of the above-mentioned CPU 7.

The above-mentioned memory 4 comprises a first storing means 4a for storing an area and the frequencies of the radio broadcasting stations in that area for each of a plurality of areas, and a second storing means 4b which can write or read the frequencies of arbitrary radio broadcasting stations. Then, the above-mentioned first storing means 4a has an area memory group $A_1$–$A_n$ and a frequency memory group $a_1$–$a_n$ of radio broadcasting stations on an area basis which are stored in each of the area memory group $A_1$–$A_n$, and the second storing means 4b has a frequency memory group $b_1$–$b_n$ which can be written or read arbitrarily. Furthermore, the above-mentioned area memory group $A_1$-$A_n$, as shown in FIG. 2, has a frequency memory group $a_1$-$a_n$ in each frequency band of the AM band, FM band and the TV band, and these are determined properly depending on the number of radio broadcasting stations in each area $A_1$-$A_n$, being stored in advance. This memory is configured as in a read-only type which cannot be re-written, and this configuration prevents a re-write by mistake of a memory of an area of unknown receiving frequency for the frequency of the radio broadcasting station which differs on an area basis.

Next, the above-mentioned selection operating means 5 comprises a first selection operating means 5a for selecting the area memory group $A_1$-$A_n$ stored in the above-mentioned first storing means 4a and the second storing means 4b capable of free presetting, and a second selection operating means 5b for selecting the above-mentioned stored frequency group $a_1$-$a_n$ or $b_1$-$b_n$, that is, the frequency of the necessary radio broadcasting station. Here, the second selection operating means 5b has band switches for switching-over the frequency bands of AM band, FM band and TV band, and a memory select switch which selects and reads a desired stored frequency from the frequency memory group $a_1$-$a_n$ and $b_1$-$b_n$ in each band, and the memory select switch for reading is configured with a scroll system by one key or a plurality of specific keys. Also, It has a station select switch consisting of an up/down switch which can arbitrarily select the receiving frequency when the second storing means 4b is selected by the above-mentioned first selection operating means 5a, and a memory switch for writing the frequency of an arbitrary desired radio broadcasting station to the second storing means 4b. Furthermore, it has a power switch for ON/OFF control of the power source and other necessary operation switches.

FIG. 3 shows an example wherein the selection operating means 5 is configured with matrix key switches. This means that it has keys $K_1$-$K_9$ and terminals $T_1$-$T_7$ for giving a signal input to the above-mentioned operation inputting means 10 in correspondence to a push thereof, and the operation inputting means 10 generates a code signal corresponding to a short-circuit of the terminals $T_1$-$T_7$ by a push of the key $K_1$-$K_9$. Here, $K_1$ designates a power switch key, $K_2$ and $K_3$ designate station select UP/DOWN keys, $K_4$ designates a band switch key, $K_5$ designates an area select switch key, and $K_7$ designates a memory switch key for writing. Then, the key $K_6$ is equivalent to the above-described first selection operating means 5a, and the band switch key $K_4$ and the memory select switch key $K_5$ are equivalent to the second selection operating means 5b, and after selecting an area by the key $K_6$, switching to a desired band by the key $K_4$ and selection of a desired radio broadcasting station are performed. In addition, by the keys $K_8$ and $K_9$ and the operating means using the keys $K_9$ and $K_7$, and by a clock means provided in the station selection controlling means 3, a timer and an alarming function as described later are provided.

Next, description is made on the above-mentioned display unit 6 in reference to FIG. 4. The display unit has an area display part 12 showing the receiving area, a band and/or AM/PM display part 13, a frequency or time display part 14, a memory channel display part 15, and a display part 16 of other functions. The above-mentioned area display pare 12 displays TOKYO 12a, NAGOYA 12b, OSAKA 12c, JR NEW SUPEREXPRESS (Shinkansen) LINE 12d and FREE 12e, and TOKYO 12a—JR NEW SUPEREXPRESS LINE 12d are equivalent to the displays of the area memory group $A_1$-$A_n$ in the above-described first storing means 4a, and FREE 12e is equivalent to the display of the second storing means 4b. The above-mentioned display part 13 has receiving band display parts of AM band 13a, FM band 13b and TV band 13c as a band display in receiving, and display parts of forenoon AM 13a as clock display (used also for the AM band in receiving) and afternoon PM 13d. The above-mentioned display part 14 has segments for numeric display, a colon 14a for time display and a dot 14b for displaying a decimal point in frequency display, and displays the time in non-receiving state, displays the frequency (KHz or MHz) in AM or FM receiving. and displays the channel (1–12ch) in TV receiving, respectively. Also, the above-mentioned display part 15 displays the memory channel of the frequencies (the above-mentioned $a_1$-$a_n$ or $b_1$-$b_n$) which are stored in each of the memory groups $A_1$-$A_n$ and 4b in selection on the above-mentioned area display part 12a–12d and free display part 12e, and has a display M 15a showing the memory receiving state and a memory channel display part 15b. The above-mentioned display part 16 for other functions has a display 16a showing setting of alarm time, a display 16b showing an alarm of expiration of a predetermined time, and a display 16c showing an alarm of reduction in voltage, that is, replacement of buttery.

Here, description is made on the relation to the clock function with reference to FIG. 3 and FIG. 4. When the power switch key $K_1$ is turned off, the display part 13 shows morning and afternoon of the time by the display arts 13a and 13b, and the display part 14 displays a time 12:00–11:59. Then, the current time can be adjusted by pushing the up/down keys $K_2$ and $K_3$ while pushing the time set key $K_7$ used also for the above-mentioned memory. Furthermore, an alarm of expiration of a predetermined time is set by pushing the alarm key $K_8$, and the setting thereof is displayed by lighting the above-mentioned display 16b, and an appropriate predetermined time (1–180 minutes) can be set by pushing the up/down keys $K_2$ and $K_3$ while pushing the key $K_8$. Also, the alarm time can be adjusted by changing the current time on the display part 14 to the alarm time by pushing the stand-by key $K_9$, and pushing the up/down keys $K_2$ and $K_3$ while pushing the key $K_9$, and by releasing the push of the key $K_9$, the display 16a is lit to show the setting.

Figure 5A:
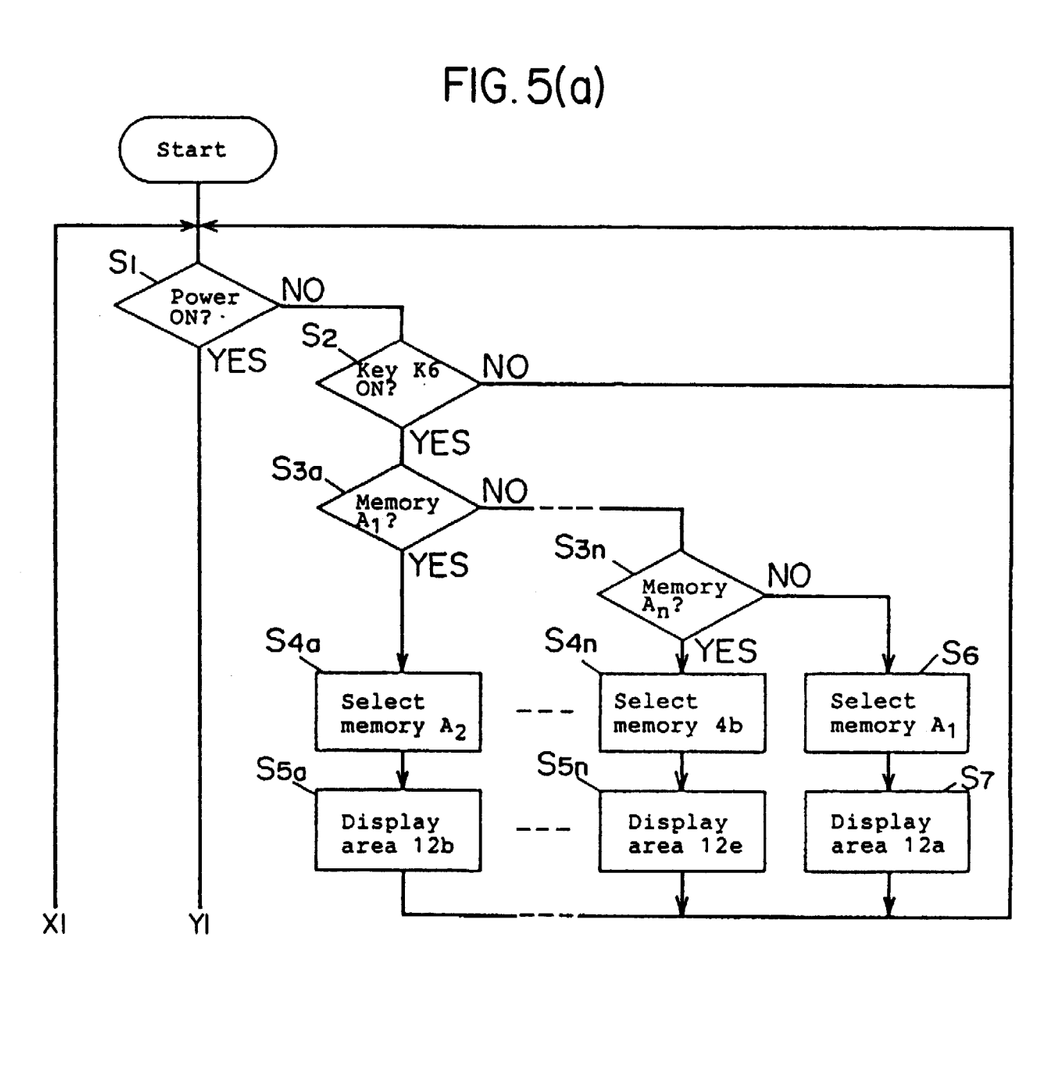
FIGS. 5(a) and 5(b) represent a flowchart of the same.
Figure 5B:
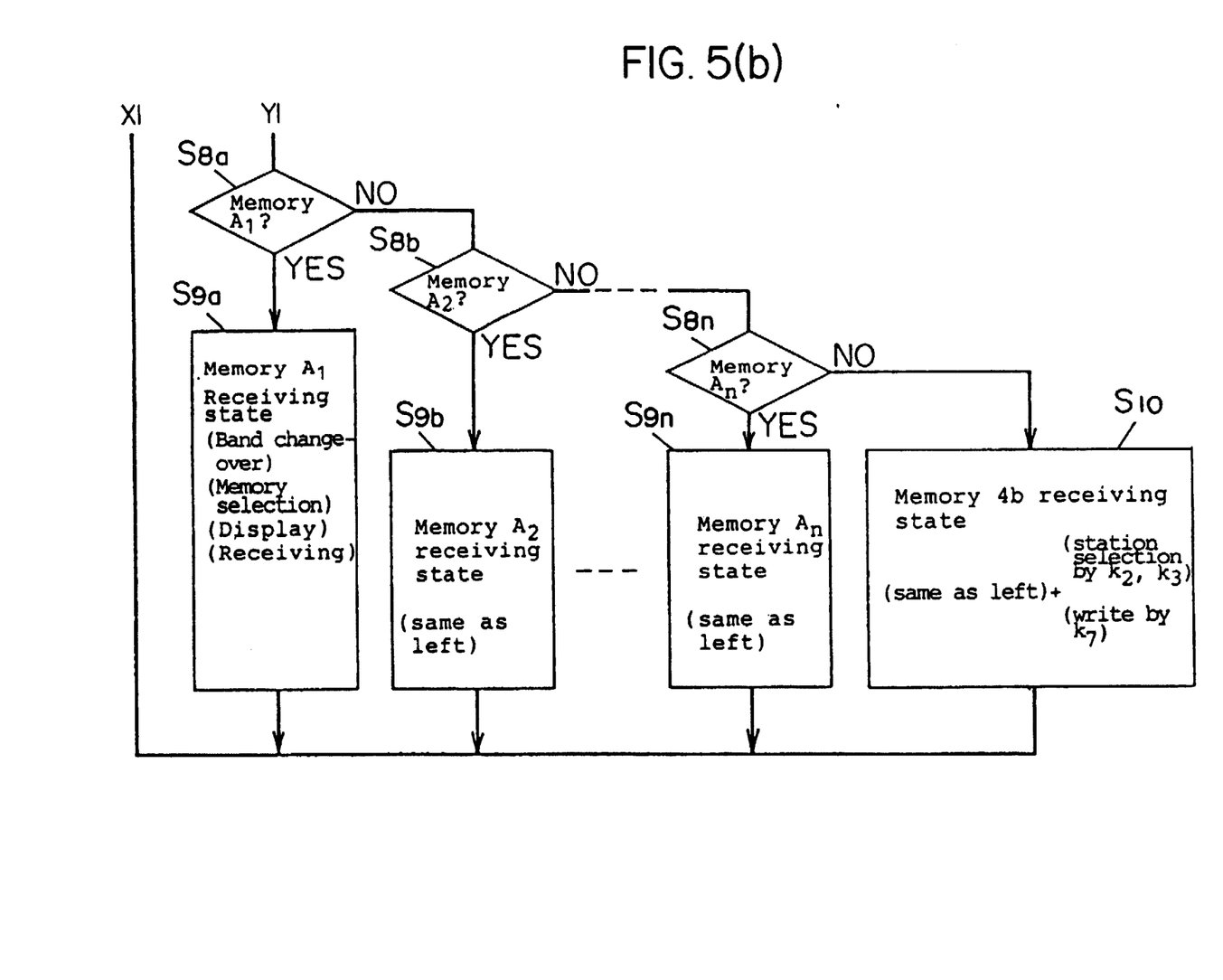

Next, description is made on the station selecting operation based on a flowchart in FIG. 5. First, in Step $S_1$, whether power is put in an ON state or an OFF state by the key $K_1$ is judged, and when power is in an OFF state, processing proceeds to Step $S_2$, and the ON or OFF state of the area select key $K_6$ is judged, and when it is OFF, processing returns to the former step, and by turning on the key $K_6$, processing proceeds to the next step $S_3$. In this step $S_{3a}$, judgment is made on whether or not the area memory $A_1$ is first selected among the area memory group $A_1$-$A_n$ when the key $K_6$ is turned on (note that n=4 in the embodiment as shown in FIG. 4), and when $A_1$ is selected, the next area memory $A_2$ is selected in Step $S_{4a}$, and the area display part 12b is lit in Step $S_{5a}$. On the other hand, when $A_1$ is not selected in tilts step $S_{3a}$, processing proceeds to the next step $S_{3b}$ (not illustrated), and proceeds up to Step $S_{3n}$ in sequence by similar judgments, and where judgment results in YES in Steps $S_{3b}$-$S_{3n}$ like the above-mentioned case, the memory groups $A_3$-$A_n$ and 4b are selected in Steps $S_{4b}$-$S_{4n}$, and the area display parts 12c–12e are lit in Steps $S_{5b}$-$S_{5n}$. Then, where judgment results in NO in Step $S_{3n}$, the area memory $A_1$ is selected in Step $S_6$, and the area display part 12a is lit in Step $S_7$. This means that in the power-off state, the memory groups $A_1$-$A_n$ and 4b can be changed-over every time the area select key $K_6$ is pushed (in other words, the first selection operating means 5a), and the area display parts 12a–12e can be displayed in a sequential change-over fashion, and any of them is lit all the time.

Then, in the above-mentioned Step $S_1$, when power is put in an ON state by pushing the key $K_1$, receiving is made possible, and processing proceeds to Step $S_{8a}$. In this Step $S_{8a}$, judgment is made on whether or not $A_1$ is selected from among the area memory group $A_1$—$A_n$, and when $A_1$ is selected, processing proceeds to the next Step $S_{9a}$, and the state of receiving the area memory $A_1$ is brought about. In this Step $S_{9a}$, selection of receiving frequency of the desired radio broadcasting station in the appropriate area is performed by band switch-over by an operation of the key $K_4$ and selection from the frequency memories $a_1$–$a_n$ by an operation of the key $K_5$, and the band displays 13a–13c, the frequency display 14, and the memory channel display 15b are performed, and thereby receiving of that radio broadcasting is made possible. On the other hand, when judgment results in NO in Step $S_{8a}$, processing proceeds sequentially to Steps $S_{8b}$–$S_{8n}$, and judgment is made on whether or not the selected areas are the area memory $A_2$–$A_n$ respectively, and when the selected areas are $A_2$–$A_n$, processing proceeds to Steps $S_{9b}$–$S_{9n}$, and in these Steps $S_{9b}$–$S_{9n}$, actions similar to those in Step $S_{9a}$, that is, selective receiving and display, are performed in the respective area memories $A_{2\_An}$. Furthermore, when judgment results in NO in Step $S_{8n}$, processing proceeds to Step $S_{10}$, the receiving state of the storing means 4b is brought about (that is, the FREE state), and selection of the frequency memories $b_1$–$b_n$ is performed like the above-mentioned case. In this Step $S_{10}$, up/down selection of the receiving frequency by the keys $K_2$ and $K_3$ is possible, and a desired frequency can be written (re-written) arbitrarily to the memories $b_1$–$b_n$ by operation of the key $K_7$.

Next, description is made of a second embodiment based on FIG. 6–FIG. 9. In FIG. 6–FIG. 9, the same numerals and symbols as those in the above-mentioned first embodiment designate the same parts.

Figure 6:
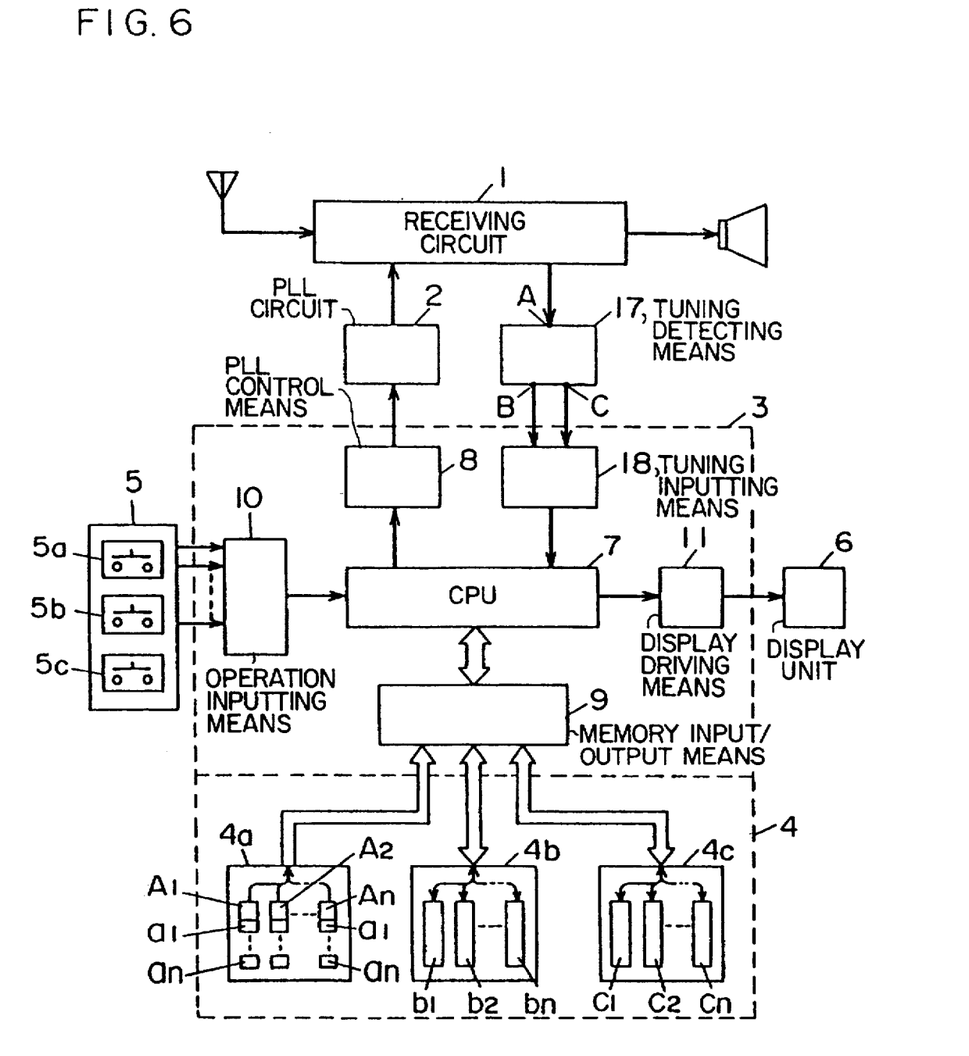
FIG. 6 is a block diagram showing a second embodiment.
Figure 8:
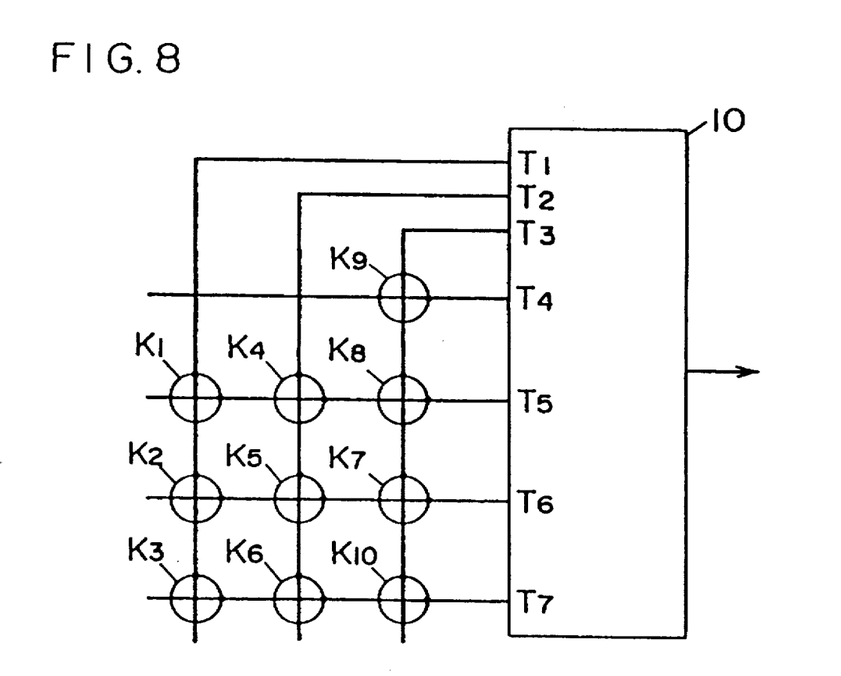
FIG. 8 is a circuit diagram showing a specific example of a selection operating means of the same, FIGS. 9(a) and (b) represent a flow chart of the same.

In FIG. 6, numeral 17 designates a tuning detecting means which detects whether or not the receiving circuit 1 has tuned above a certain level. Numeral 18 designates a tuning inputting means in the station selection controlling means 3, which makes the CPU 7 operate based on an output of the above-mentioned tuning detecting means 17. Numeral 4c designates a third storing means provided in the memory 4, and the third storing means is configured to read and write like the above-mentioned second storing means 4b, and stores the frequencies of the radio broadcasting stations tuned by sweep in an automatic search for identifying the area of use as described later. Also, numeral 5c designates an automatic search start operating means, which is operated to write to the above-mentioned third storing means 4c, and is a key $K_{10}$ as shown in FIG. 8 when shown by a configuration with matrix key switches, and the keys $K_1$– $K_9$ are similar to the above-described ones.

Figure 7:
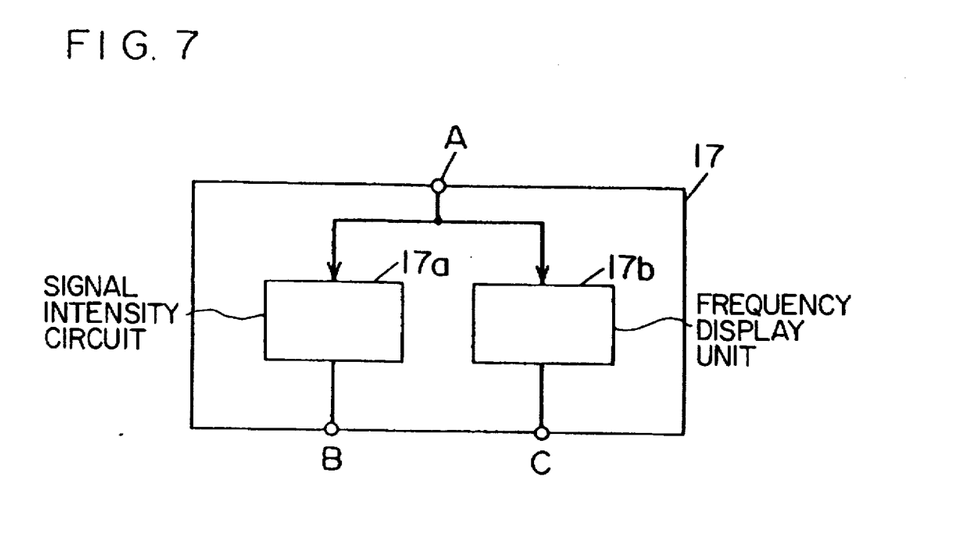
FIG. 7 is a detailed block diagram of a tuning detecting means of the same.

The above-mentioned tuning detecting means 17 takes out an intermediate frequency signal of the receiving circuit 1 and applies it to an input terminal A, and comprises a signal intensity detecting circuit 17a which detects whether or not the intensity of a signal received by amplitude detection of the intermediate frequency signal is above a certain level, and a frequency detecting circuit 17b which detects that the value of the frequency is a predetermined value when the d.c. component (S curve voltage) of the detected signal of the intermediate frequency signal is within a predetermined voltage range, and both circuits supply detection outputs respectively from terminals B and C to the above-mentioned tuning inputting means 18.

Figure 9A:
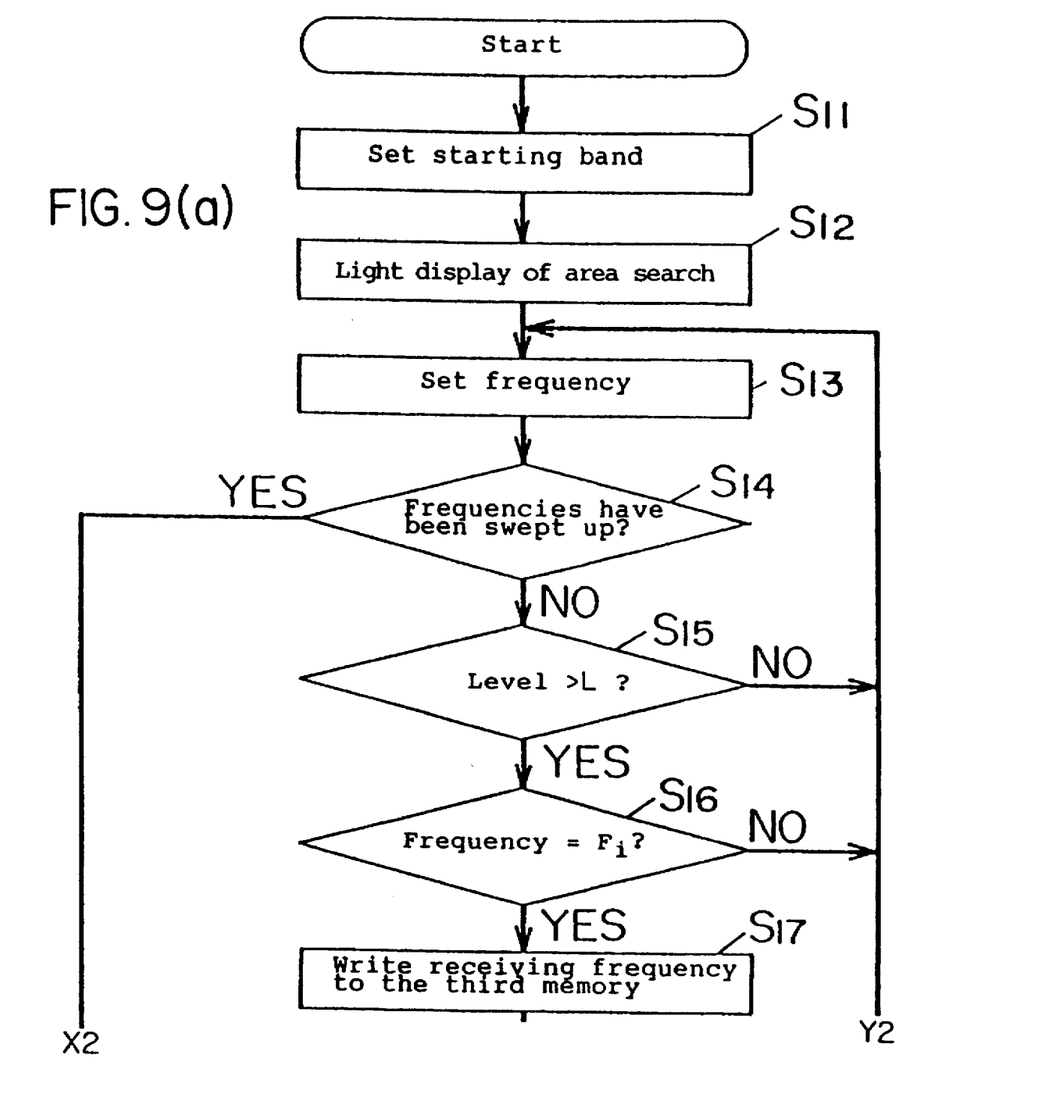
Figure 9B:
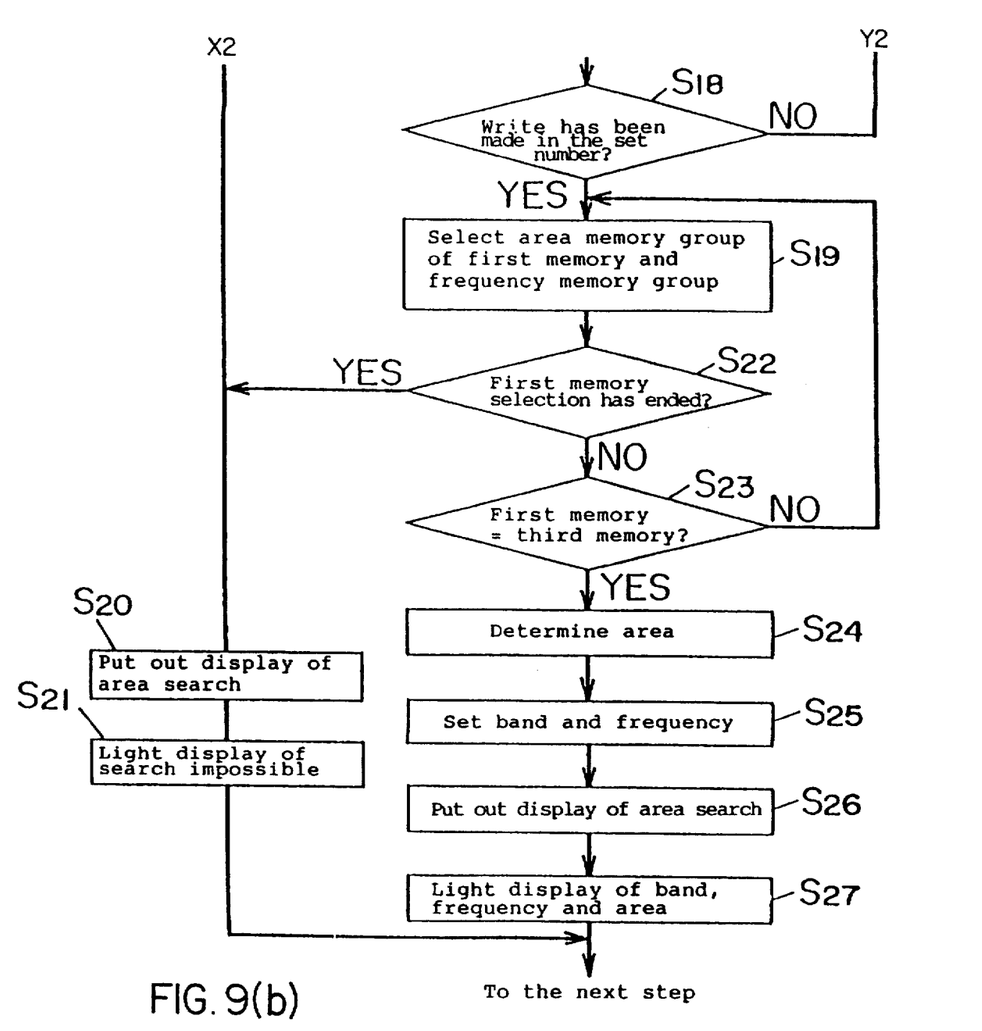

Next, description is made of selection of the receiving area by automatic search in this second embodiment along with a flow chart in FIG. 9. First, to identify the area where the receiver is used, an automatic search is started by operating the automatic search start operating means 5c (key $K_{10}$). Then, in Step $S_{11}$, a starting band is set (here, set to the FM band capable of high-speed search), and NOW IN AREA SEARCH is lit on the display unit 6 (properly added to the above-described display unit in FIG. 4) (Step $S_{12}$). In the next Step $S_{13}$, a receiving sweep is started with a minimum value $f_{min}$ of the FM band at predetermined frequency intervals. In Step $S_{14}$, judgment is made on whether or not the frequencies have been swept up (that is, the sweep has been done from $f_{min}$ to $f_{max}$) every time the frequency is set, and when the judgment results in NO, in the next Step $S_{15}$, one level is generated when a detection of the above-mentioned signal intensity detecting circuit 17a is above a certain level, and processing proceeds to the next Step $S_{16}$. Here, when the frequency in the above-mentioned frequency detecting circuit 17b is a predetermined value (for example, 10.7 MHz in the case of FM), processing proceeds to the next Step $S_{17}$. Where the judgments in these Steps $S_{15}$ and $S_{16}$ result in YES, the sweep of receiving is stopped at once, and in Step $S_{17}$, the appropriate receiving frequency is written to the third storing means 4c. Then, in the next Step $S_{18}$, judgment is made on whether or not writes of a plurality of frequencies to be set in the third storing means have been made to the third storing means 4c, and where the writes have been performed, processing proceeds to the next Step $S_{19}$. On the other hand, when the judgments result in NO in Step $S_{15}$ and $S_{16}$ including this Step $S_{18}$, processing returns to Step $S_{13}$, and similar operations are performed repeatedly for the next frequency. Then, when the judgment of write of the set number results in NO in Step $S_{18}$ despite the fact that the frequencies have been swept up (that is, $f_{min}$–$f_{max}$), processing proceeds to the YES side in Step $S_{14}$, that is, to Step $S_{20}$, and the display of NOW IN AREA SEARCH is extinguished, and a display of SEARCH IMPOSSIBLE is lit in Step $S_{21}$.

In Step $S_{19}$, the area memory group $A_1$–$A_n$ in the first storing means 4a are selected, and, for example, the frequencies of the frequency memory group $a_1$–$a_n$ in the selected area memory $A_1$ are compared with the receiving frequencies $C_1$–$C_n$ written to the third storing means 4c in Step S17, in Step $S_{23}$ through the next Step $S_{22}$, and when the both agree with each other, processing proceeds to Step $S_{24}$, and the receiving area is determined. On the other hand, where both groups do not agree with each other in Step $S_{23}$, processing returns to Step $S_{19}$, the next area memory $A_2$, is selected and a comparison is taken again in Step $S_{23}$ through Step $S_{22}$. Then, a loop of these Steps $S_{19}$, $S_{22}$ and $S_{23}$ are performed in sequence, and all area memories $A_1$–$A_n$ of the first storing means 4a are selected, and where the frequency memory group $a_1$–$a_n$ are compared with the frequencies $c_1$–$c_n$ of the third storing means 4c and don't agree therewith, processing proceeds from the YES side of Step $S_{24}$, the band and the frequency in that area are set in Step $S_{25}$ (these band and frequency may be set properly, but may be set by one last memory as described later). Next, in Step $S_{26}$, the display of NOW IN AREA SEARCH is put out, and in Step $S_{27}$, displays of band, receiving frequency and area are lit. Here, the automatic area search is completed, and the area where the receiver is used at that time is automatically searched, and the selection is completed.

In addition, the reason of requiring writes of a plurality of set frequencies to the third storing means 4c in the above-mentioned Step $S_{18}$ is to correctly select the appropriate radio broadcasting station where radio broadcasting stations of the same frequency exist in different areas, and whether the store of two stations is enough or the storage of three or more stations is required has only to be properly set in reference to schedules of opening radio broadcasting stations in the future.

Figure 10:
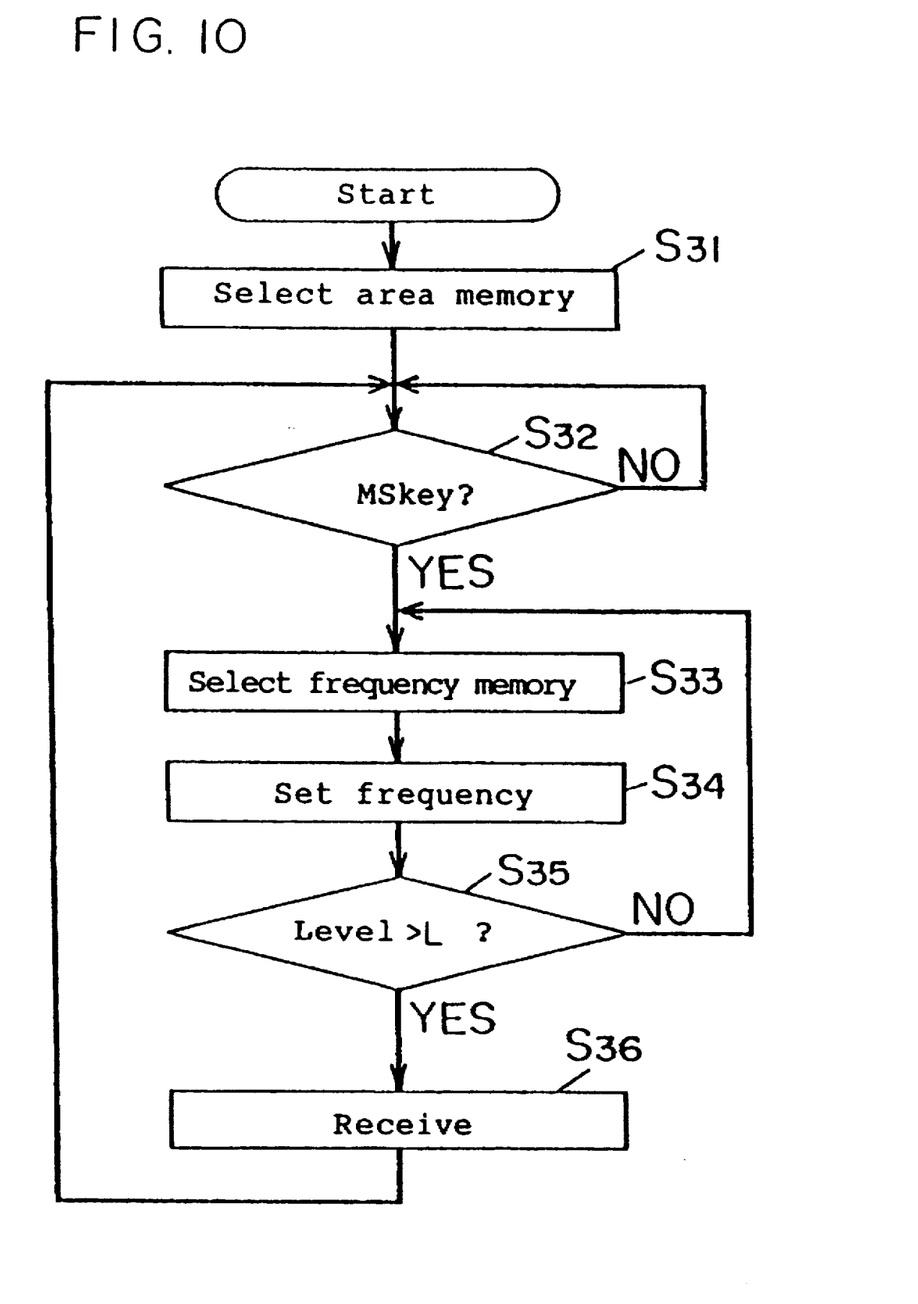
FIG. 10 is a flow chart of a third embodiment.

Next, description is made of a third embodiment of the present invention. In a block diagram as shown in FIG. 6, this embodiment has a configuration of a flowchart as shown in FIG. 10, and to be brief, in selecting the radio broadcasting station after selecting the receiving area by utilizing the tuning detecting means 17, radio broadcasting stations tuned below a certain level are automatically skipped.

Hereinafter, description is made on based on the flow chart shown in FIG. 10. First, in Step $S_{31}$, selection of the receiving area memory is performed. This selection is made by operating the area select switch key $K_6$, or by operating the automatic search key $K_{10}$. Next, it, Step $S_{32}$, whether or not the memory select switch key $K_5$ has been operated is judged, and when the key has been operated, processing proceeds to the next Step $S_{33}$, and when the key has been operated, the same judgment is repeated. In Step $S_{33}$, the frequency memory group $a_1-a_n$ in the appropriate area is selected, and in the next Step $S_{34}$, the frequency of the selected memory group $a_1-a_n$ is set, and the level of the received signal at that time is judged based on the output of the signal intensity detecting circuit 17a. When the level is low, processing returns to Step $S_{33}$, and judgement is made again on the next frequency, and when the level exceeds, a given level processing proceeds to the next Step $S_{36}$ and the receiving state is brought about. This means that radio broadcasting stations of low receiving levels are skipped by judgment in Step $S_{35}$.

Figure 11A:
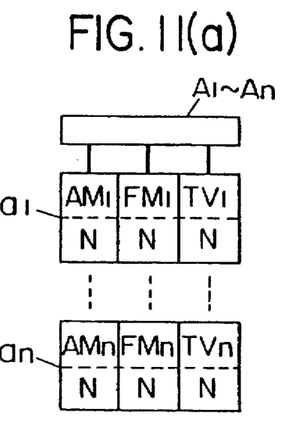
FIGS. 11(a)–(c) represents a configuration view showing another embodiment of the first storing means.
Figure 11B:
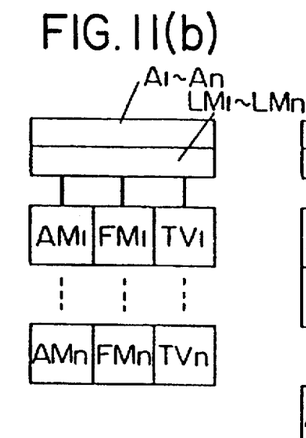
Figure 11C:
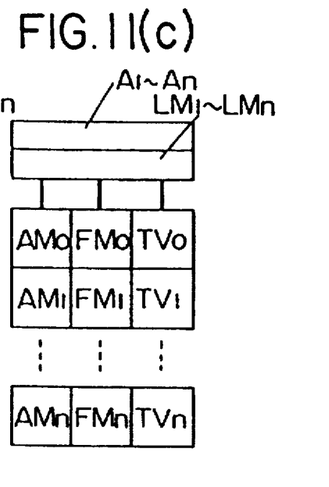

Next, description is made at another embodiment based on FIGS. 11(a)-(c).

First, in an example of FIG. 11(a), along with receiving frequencies $AM_1-AM_n$, $FM_1-FM_n$ and $TV_1-TV_n$, the name N of each radio broadcasting stations is also stored in advance in the memories $a_1-a_n$ in each area memory group $A_1-A_n$, and a name is also displayed on the above-mentioned display unit 6. As a display example thereof, it may be displayed on a separate display part along with the frequency display 14, or may be displayed in place of the frequency display 14.

Next, in an example of FIG. 11(b), area-based last storing means $LM_1-LM_n$ storing the last receiving frequency of each area before change-over in selecting the appropriate frequency are provided in each area memory group $A_1-A_n$, respectively. In the case where these storing means $LM_1-LM_n$ are not provided, setting is made so that the receiving frequency first set is, for example, the first memory $a_1$ of the AM band when each of the area memory group $A_1-A_n$ is changed-over, but by providing the area-based last storing means $LM_1-LM_n$ as mentioned above, the frequency of the last radio broadcasting station to be listened to most often in each area is stored, and it can be selected most preferentially in changing-over the area. In an example of FIG. 11(c), in addition to the example of FIG. 11(b), last storing means $AM_0$, $FM_0$ and $TV_0$ are further provided on a band basis to store the frequency of the last radio broadcasting station listened to in the appropriate band even if the band is changed-over on a area basis.

In addition, the above description is made on the example wherein the memory group $a_1-a_n$ of the frequencies stored in each of the area memory group $A_1-A_n$ of the first storing means 4a can not be re-written, but the memory group $a_1-a_n$ in these groups $A_1-A_n$ can also be configured to be arbitrarily re-written like the memory group $b_1-b_n$ of the second storing means 4b. In this case, needless to say, configuration is made so that selection of the frequency by the keys $K_2$ and $K_3$ is possible even when selecting the areas $A_1-A_n$.

Also, in the above-mentioned embodiment, selection of the area memory group by the first selection operating means (that is, 5a or the key $K_6$) is made possible only in the non-receiving state, but selection of the area memory can also be made possible in the receiving state (that is, the power-on state). For this purpose, Steps $S_2-S_7$ have only to be inserted after Steps $S_{9a}-S_{9n}$ and $S_{10}$ in the flow chart of FIG. 5.

The present invention is configured as described above, and by storing radio broadcasting stations in a plurality of areas in advance, the radio broadcasting station can be selected easily and reliably by a simple operation without selecting the station while taking the trouble of scrolling through frequencies even if the receiving frequency is unknown in the case of visiting the appropriate area on a private or business trip or the like, and memory and selection of even more radio broadcasting stations can be performed by the storing means capable of arbitrarily storing stations.

Furthermore, the first selection operating means for selecting the area and the second selection operating means for selecting the frequency of the stored radio broadcasting station are provided, and displays thereof are performed, and thereby a receiver can be obtained which is more reliable and in which it is easy to find the current receiving state, and is more convenient to operate by displaying the name of radio broadcasting station.

Furthermore, selection of the area by the first selection operating means is made possible only in the non-receiving state, and thereby even if the first selection operating key is operated by mistake in the state of station selection receiving, such problems can be prevented as the receiving changing to that of another station, thereby causing confusion.

Furthermore, the receiving sweep is started by an automatic search start signal, and the appropriate receiving frequency is stored every time the sweep is stopped by a detection of the tuning detecting means, and the memory of this receiving frequency is compared with the frequencies of the radio broadcasting stations in a plurality of areas which are stored in advance, and thereby the receiving area where the frequencies agree is selected, and the receiving of the radio broadcasting station in that area is made possible, and thus the receiving frequency in an unknown area can be simply selected only by performing an operation of automatic search start. In addition, the area searching is clear at a glance by display, and this is very convenient.

Furthermore, in the case where the level of the signal received from the radio broadcasting station stored in advance is lower than a certain level, by skipping that radio broadcasting station, the use of the receiver in an area of unknown receiving frequency becomes very convenient.

We claim:

1. A receiver that selectively receives broadcast signals at a plurality of frequencies, said receiver comprising:

state setting means for setting said receiver in one of a receiving state and a non-receiving state and for providing a state signal indicative thereof;

receiving means for receiving a broadcast signal at a frequency corresponding to a frequency control signal input thereto;

first storing means for storing a plurality of frequency groups, each frequency group corresponding to a predetermined geographic area and comprising a plurality of frequencies, each frequency in said plurality of frequencies corresponding to a broadcast station in said area;

second storing means for storing a second plurality of frequencies, each of said frequencies in said second plurality of frequencies corresponding to an arbitrary broadcast station irrespective of its geographical location;

first selection operating means for selecting a frequency group stored in said first storing means when said state signal indicates said receiver is in a non-receiving state;

second selection operating means for selecting a frequency from one of said frequency group selected by said first selection operating means and said second storing means, said frequency corresponding to a desired broadcast station; and station selection controlling means responsive to said second selection operating means for providing, to said receiving means, said frequency control signal, where said frequency control signal corresponds to said frequency representative of said desired broadcast station.

2. A receiver that selectively receives broadcast signals at a plurality of frequencies, said receiver comprising:

receiving means for receiving a broadcast signal at a frequency corresponding to a frequency control signal input thereto;

first storing means for storing a plurality of frequency groups, each frequency group corresponding to a predetermined geographic area and comprising a plurality of frequencies, each frequency in said plurality of frequencies corresponding to a broadcast station in said area;

second storing means for storing a second plurality of frequencies, each of said frequencies in said second plurality of frequencies corresponding to an arbitrary broadcast station irrespective of its geographical location;

first selection operating means for selecting a frequency group stored in said first storing means and for generating a disable signal responsive to said selection;

second selection operating means for selecting a frequency from one of said frequency group selected by said first selection operating means and said second plurality of frequencies stored in said second storing means, said frequency selected by said second selection operating means corresponding to a first desired broadcast station;

station selection means for selecting, in the absence of said disable signal, a frequency representative of a second desired broadcast station;

writing means for storing said frequency selected by said station selection means in said second storing means; and station selection controlling means responsive to said second selection operating means and said station selection means for providing, to said receiving means, said frequency control signal, where said frequency control signal corresponds to said frequency representative of one of said desired broadcast stations.

3. A receiver that selectively receives broadcast signals at a plurality of frequencies, said receiver comprising:

state setting means for setting said receiver in one of a receiving state and a non-receiving state and for providing a state signal indicative thereof;

receiving means for receiving a broadcast signal at a frequency corresponding to a frequency control signal input thereto;

first storing means for storing a plurality of frequency groups, each frequency group corresponding to a predetermined geographic area and comprising a plurality of frequencies, each of said plurality of frequencies corresponding to a broadcast station in said area;

tuning detecting means for detecting when a signal at said frequency corresponding to a desired broadcast station is received at an intensity higher than a predetermined level and for providing a tuning signal indicative thereof;

automatic sweep means for generating, in the absence of said tuning signal, said frequency control signal in a continuously increasing fashion and for holding said frequency control signal constant in the presence of said tuning signal;

second storing means for storing a frequency corresponding to said frequency control signal when said frequency control signal is held constant;

frequency group selecting means for comparing frequencies stored in said second storing means with frequency groups stored in said first storing means and for selecting one of said frequency groups having a maximum number of frequencies in common with said frequencies in said second storing means; and first selection operating means for selecting a frequency group stored in said first storing means when said state signal indicates said receiver is in a non-receiving state;

second selection operating means for selecting a frequency from a currently selected frequency group, said frequency corresponding to a desired broadcast station; and station selection controlling means responsive to said second selection operating means for providing, to said receiving means, said frequency control signal, where said frequency control signal corresponds to said frequency representative of said desired broadcast station responsive to said tuning signal.

4. The receiver of claim 3 further comprising:

third storing means for storing a second plurality of frequencies, each of said frequencies in said second plurality of frequencies corresponding to an arbitrary broadcast station irrespective of its geographical location, wherein said first selection operating means selects a frequency from one of said frequency group selected by said first selection operating means and said third storing means, said frequency corresponding to a desired broadcast station.

5. A receiver that selectively receives broadcast signals at a plurality of frequencies, said receiver comprising:

receiving means for receiving a broadcast signal at a frequency corresponding to a frequency control signal input thereto;

first storing means for storing a plurality of frequency groups, each frequency group corresponding to a predetermined geographic area and comprising a plurality of frequencies, each of said plurality of frequencies in said plurality of frequencies corresponding to a broadcast station in said area;

second storing means for storing a second plurality of frequencies, each of said frequencies in said second plurality of frequencies corresponding to an arbitrary broadcast station irrespective of its geographical location;

tuning detecting means for detecting when a signal at said frequency corresponding to a desired broadcast station is received at an intensity higher than a predetermined level and for providing a tuning signal indicative thereof;

automatic sweep means for generating, in the absence of said tuning signal, said frequency control signal in a continuously increasing fashion and for holding said frequency control signal constant in the presence of said tuning signal;

third storing means for storing a frequency corresponding to said frequency control signal when said frequency control signal is held constant;

frequency group selecting means for comparing frequencies stored in said third storing means with frequency groups stored in said first storing means and for selecting one of said frequency groups having a maximum number of frequencies in common with said frequencies in said second storing means; and first selection operating means for selecting a frequency group stored in said first storing means and for generating a disable signal responsive to said selection;

second selection operating means for selecting a frequency from a currently selected frequency group, said frequency corresponding to a first desired broadcast station;

station selection means for selecting, in the absence of said disable signal, a frequency representative of a second desired broadcast station from said currently selected frequency group;

writing means for storing said frequency selected by said station selection means in said second storing means; and station selection controlling means responsive to said second selection operating means and said station selection means for providing, to said receiving means, said frequency control signal, where said frequency control signal corresponds to said frequency representative of said desired broadcast station responsive to said tuning signal.

6. The receiver of any one of claims 1–5 further comprising:

a display unit including an area name display part responsive to said first selection operating means for indicating said predetermined geographic areas and a receiving frequency display part responsive to said second selection operating means for indicating a frequency corresponding to a signal being received by said receiving means.

7. The receiver of any one of claims 1–5 further comprising:

a display unit including an area name display part responsive to said first selection operating means for indicating said predetermined geographic areas and a receiving broadcasting station name display part responsive to said second selection operating means for indicating a name of a broadcasting station corresponding to a signal being received by said receiving means.

8. The receiver of one of claims 3–5, said display unit comprising:

means for displaying a sign indicative of one of an automatic search operation in progress and a malfunction of said automatic search operation when said automatic sweep means generates said frequency control signal.

\* \* \* \* \*

UNITED STATES PATENT AND TRADEMARK OFFICE
CERTIFICATE OF CORRECTION

PATENT NO.   : 5,537,674
DATED        : July 16, 1996
INVENTOR(S)  : KISHIMOTO et al It is certified that error appears in the above-indentified patent and that said Letters Patent is hereby corrected as shown below:

On the title page:Item

[30]    Foreign Application Priority Data

Nov. 29, 1989 [JP] Japan . . . . 1-309679

Signed and Sealed this

Seventh Day of January, 1997

*Attest:*

BRUCE LEHMAN

*Attesting Officer*    *Commissioner of Patents and Trademarks*